(12) United States Patent
Stemmer

(10) Patent No.: US 8,994,373 B2
(45) Date of Patent: Mar. 31, 2015

(54) MAGNETIC RESONANCE SYSTEM AND METHOD TO ADJUST AT LEAST ONE SHIM CURRENT AND AN ASSOCIATED RF CENTER FREQUENCY DURING AN INTERLEAVED MULTISLICE MR MEASUREMENT OF A MOVING EXAMINATION SUBJECT

(75) Inventor: Alto Stemmer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 364 days.

(21) Appl. No.: 13/423,488

(22) Filed: Mar. 19, 2012

(65) Prior Publication Data

US 2012/0235681 A1 Sep. 20, 2012

(30) Foreign Application Priority Data

Mar. 17, 2011 (DE) .......................... 10 2011 005 726

(51) Int. Cl.
*G01R 33/44* (2006.01)
*G01R 33/565* (2006.01)
*G01R 33/483* (2006.01)
*G01R 33/563* (2006.01)
G01R 33/561 (2006.01)

(52) U.S. Cl.
CPC ...... *G01R 33/56563* (2013.01); *G01R 33/4835* (2013.01); *G01R 33/56383* (2013.01); *G01R 33/5613* (2013.01); *G01R 33/5614* (2013.01)
USPC ............................ 324/307; 324/309; 324/318

(58) Field of Classification Search
CPC ..................... G01R 33/56509; G01R 33/4835; G01R 33/5613; G01R 33/5614; G01R 33/56383; G01R 33/56563

USPC .................................................. 324/300-322
See application file for complete search history.

(56) References Cited

U.S. PATENT DOCUMENTS

| 5,602,480 | A  | * | 2/1997  | Onodera et al. | 324/320 |
|-----------|----|---|---------|----------------|---------|
| 6,614,225 | B1 | * | 9/2003  | Feinberg       | 324/307 |
| 7,145,338 | B2 |   | 12/2006 | Campagna et al.|         |
| 2005/0154291 | A1 |   | 7/2005  | Zhao et al.  |         |
| 2010/0182007 | A1 |   | 7/2010  | Dornhaus et al.|       |
| 2010/0244823 | A1 |   | 9/2010  | Abe et al.   |         |
| 2011/0018537 | A1 | * | 1/2011  | Warntjes     | 324/309 |

OTHER PUBLICATIONS

Weckbach, S., et al. "Comparison of a new whole-body continuous-table-movement protocol versus a standard whole-body MR protocol for the assessment of multiple myeloma." European radiology 20.12 (2010): 2907-2916.*

(Continued)

*Primary Examiner* — Melissa Koval
*Assistant Examiner* — Rishi Patel
(74) *Attorney, Agent, or Firm* — Schiff Hardin LLP

(57) ABSTRACT

In a method and system to adjust at least one shim current in a shim channel of a magnetic resonance apparatus and an associated RF center frequency for the radio-frequency system of the magnetic resonance apparatus during an interleaved multislice MR measurement of a moving examination subject, in which MR measurement at least two excitations are implemented for complete acquisition of the desired data of a slice of the examination subject that is to be measured, the multislice MR measurement is implemented such that phase discontinuities between measurement data acquired after individual excitations are avoided.

8 Claims, 5 Drawing Sheets

(56) References Cited

OTHER PUBLICATIONS

"Sliding Multislice (SMS): A New Technique for Minimum FOV Usage in Axial Continuously Moving-Table Acquisitions," Fautz et al., Magnetic Resonance in Medicine, vol. 55 (2006), pp. 363-370.

"Continuous Adjustment of Calibration Values for Improved Image Quality in Continuously Moving Table Imaging," Shankaranarayanan et al., Proc. Intl. Soc. Mag. Reson. Med., vol. 11 (2004), p. 103.

"Principles of Whole-Body Continuously-Moving-Table MRI," Börnert et al., Journal of Magnetic Resonance Imaging, vol. 28 (2008), pp. 1-12.

"Dynamic shim updating on the human brain," Koch et al., Journal of Magnetic Resonance, vol. 180 (2006), pp. 286-296.

"Real-time feedback optimization of z-shim gradient for automatic compensation of susceptibility-induced signal loss in EPI," Tang et al., NeuroImage, vol. 35 (2011), pp. 1587-1592.

* cited by examiner

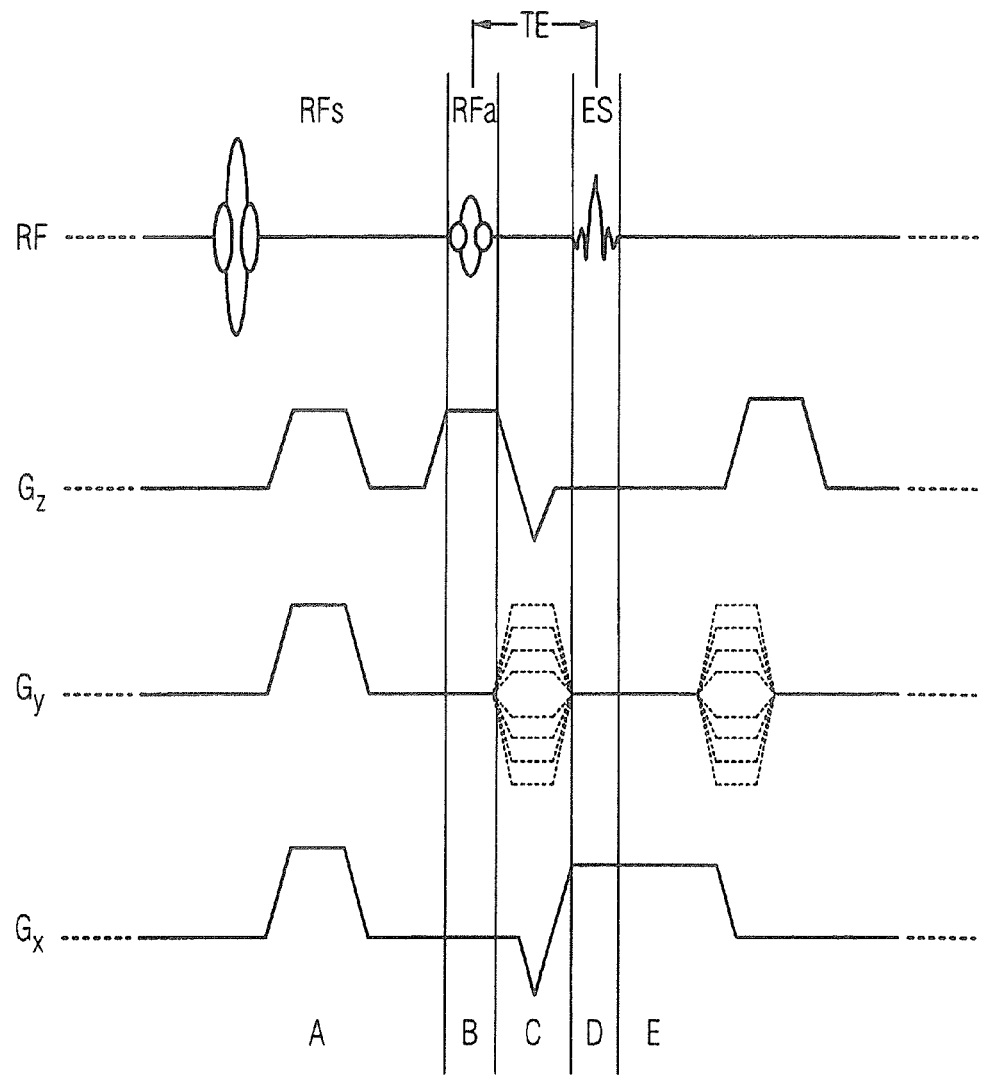

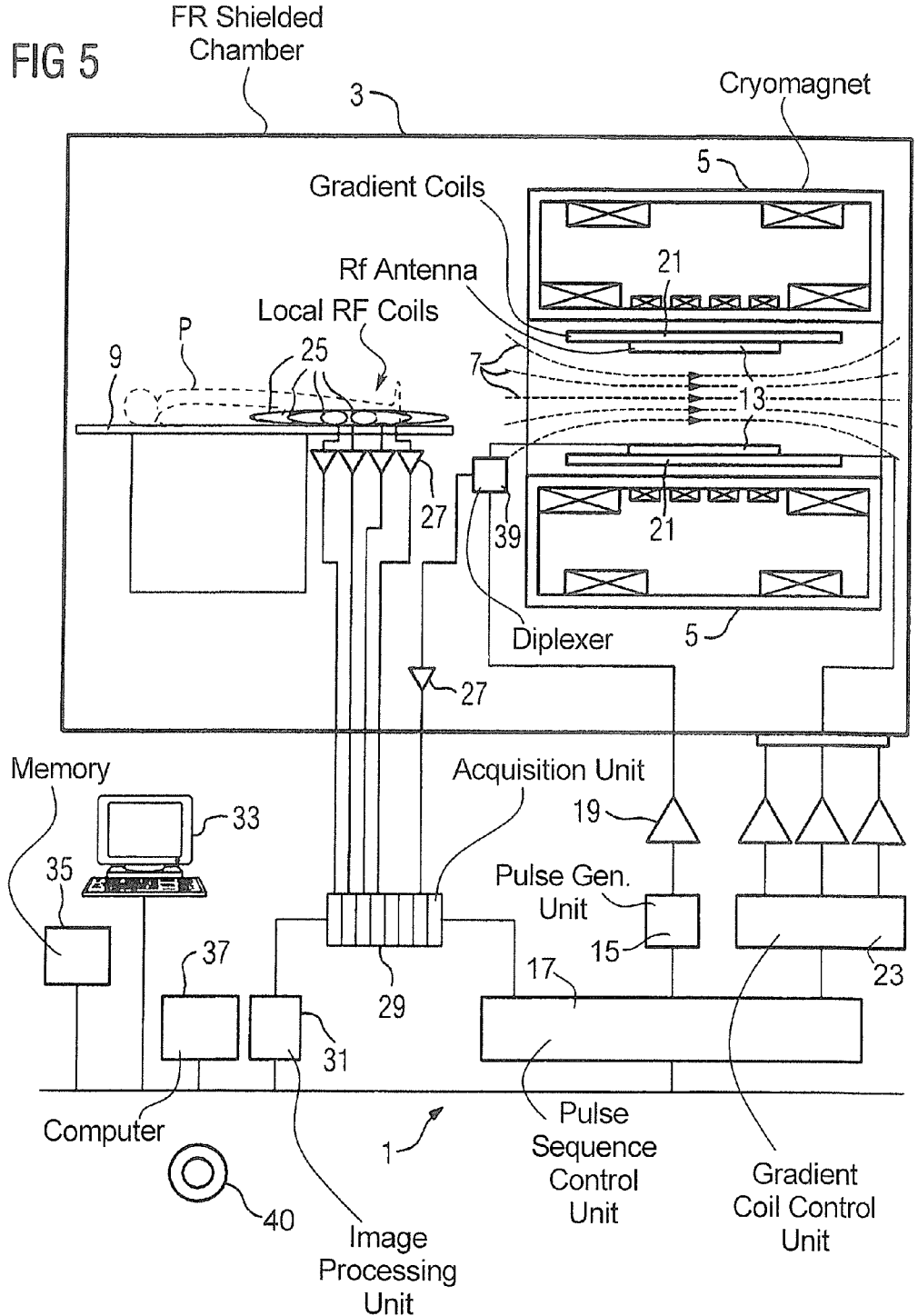

US 8,994,373 B2

MAGNETIC RESONANCE SYSTEM AND METHOD TO ADJUST AT LEAST ONE SHIM CURRENT AND AN ASSOCIATED RF CENTER FREQUENCY DURING AN INTERLEAVED MULTISLICE MR MEASUREMENT OF A MOVING EXAMINATION SUBJECT

BACKGROUND OF THE INVENTION

1. Field of the Invention

The present invention concerns a method to adjust at least one shim current in a gradient coil of a magnetic resonance apparatus and an associated RF center frequency for a radio-frequency antenna of the magnetic resonance apparatus during an interleaved, multislice MR measurement of a moving examination subject, as well as a magnetic resonance apparatus and an electronically readable data storage medium to implement such a method.

2. Description of the Prior Art

The magnetic resonance (MR) is a known technique with which images of the inside of an examination subject can be generated. The examination subject is positioned in a strong, static, homogenous basic magnetic field (also called a $B_0$ field) with field strengths of 0.2 Tesla to seven Tesla or more in a magnetic resonance data acquisition unit (scanner), such that nuclear spins in examination subject orient along the basic magnetic field. Radio-frequency excitation pulses (RF pulses) are radiated into the examination subject to produce nuclear magnetic resonances, and the resulting, emitted magnetic resonance signals are detected, and MR images are reconstructed based on these signals. For spatial coding of the measurement data, rapidly switched magnetic gradient fields are superimposed on the basic magnetic field. The acquired measurement data are digitized and stored as complex numerical values in a k-space matrix. For example, an associated MR image can be reconstructed from the k-space matrix populated with values by means of a multidimensional Fourier transformation of those values.

Magnetic resonance apparatuses are known that have a support device (for example an examination bed or table) that can be automatically driven by means of an actuator device into and out of a patient receptacle of the magnetic resonance apparatus in which the basic magnetic field is present for the acquisition of magnetic resonance images. Since the patient receptacle frequently has quite a small diameter, the patient is placed on the patient bed outside of said patient receptacle, after which the patient bed can be driven automatically into the patient receptacle by the actuator device.

MR measurements with the examination bed driven continuously through the magnet of the MR system are known. These serve to extend the region that can be depicted—known as the "field of view"—in the direction of the bed displacement ($FOV_z$) and to simultaneously limit the measurement region within the magnet.

The technique competing with the continuous bed feed (also called table feed) is the acquisition of an extended $FOV_z$ in multiple stations with a stationary bed. After all data of a station are acquired, the patient is driven with the examination bed to the next station in order to conduct the measurement again there. The measurement (acquisition of data) is interrupted during the movement of the examination bed.

A detailed overview of known MR techniques with continuous table feed is found in the article by Peter Börnert et. al.: "Principles of Whole-Body Continuously-Moving-Table MRI", Journal of Magnetic Resonance Imaging 28:1-12 (2008).

The most important MR techniques with continuous table feed can be roughly subdivided into 2D axial measurements with table feed perpendicular to the image plane, and 3D techniques in which the readout direction is oriented parallel to the direction of the table feed. The present invention relates primarily to the first group.

The optimal implementation of a method in the group of 2-D axial measurements with table feed for pillar to the image plane differs depending on the sequence type. Two basic families within this method can be differentiated again. Sequences with short TR such as TrueFISP or turboflash belong to a first family. With these sequences it is possible to acquire the data of a single slice continuously (successively) in the center of the magnet while the patient (or in general the examination subject) is driven with constant velocity $$v_{table} = \frac{d}{N_{PE}TR} \qquad (1a)$$

$$v_{table} = \frac{d}{N_r TR} \qquad (1b)$$

through the measurement volume of the MR system, wherein TR designates the time between two successive excitation slices, and $N_{PE}$ designates the number of phase coding steps per slice in a Cartesian acquisition technique (1a) or, respectively, $N_r$ designates the number of radial spokes per slice in a radial acquisition technique (1b), and d designates the interval between adjacent slices.

With this successive acquisition technique (excitation of the slices in succession one after another), the data of a first slice are completely acquired before the data acquisition of an additional slice is begun.

Sequences with longer TR—such as T1-weighted flash techniques or turbo spin echo sequences—in which a TR from 100 ms to multiple seconds is required (for example in order to achieve a desired contrast or, respectively, in order to maintain a signal to be measured) belong to a second family. In this sequence family, the successive methods just described would be inefficient since the long TR leads to very low table velocities, and therefore to very long MR measurements given a slice interval d of approximately 3 mm to approximately 8 mm according to Formula (1a/b) that is typical in MRT.

Therefore, in this second sequence family the individual slices are acquired with an interleaved acquisition technique (as is frequently also the case in conventional MR measurements given a stationary examination bed) in which data of other slices are acquired between the successive excitation of a slice. In the case of a continuously moved examination bed, between two excitations of the same slice the location of the excitation is also adapted to the velocity of the movement of the examination bed such that the same slice in the examination subject is respectively encountered, assuming that the examination subject is not displaced with respect to the bed.

For example, an examination region (thus the volume within the patient from which MR images should be acquired) is subdivided into multiple slices stacks, each composed of Ns slices. The slice stacks are measured successively. During the measurement of a slice stack, the measurement position follows a fixed anatomical position within the examination subject traveling with the examination bed. The velocity of the examination bed is selected such that the travel distance during the acquisition time of a slice stack is equal to the extent of that slice stack:

$$v_{table} = \frac{N_s d}{N_{PE} TR} \quad (2a)$$

$$v_{table} = \frac{N_s d}{N_r TR}. \quad (2b)$$

The velocity of the examination bed (and therefore the efficiency) with interleaved MR acquisition is thus increased by a factor Ns relative to the successive MR technique. For example, since the $B_0$ field of every real MR system is not ideally homogenous and the gradient fields are not ideally linear, the different measurement positions can lead to smearing or ghost artifacts depending on the acquisition technique that is used.

The successive measurement of slice stacks that are subdivided into Ns slices that was just described has the disadvantage that different slices of a slice stack are measured in different ways, which leads to different distortions of MR images reconstructed from the acquired data (which MR images assume different positions within the slice stack) due to the mentioned imperfections of the MR system. After the assembly of the MR images, these lead to discontinuities (in particular at the stack boundaries) since anatomically adjacent slices that were associated with different slice stacks assume oppositional positions within their respective slice stack. This problem is addressed by a technique known as the "Sliding Multislice" (SMS) technique that is described in the article by Fautz and Kannengießer, "Sliding Multislice (SMS): A New Technique for Minimum FOV Usage in Axial Continuously Moving-Table Acquisitions", Magnetic Resonance in Medicine 55:363-370 (2006). In the special interleaved SMS acquisition technique, identical k-space lines of different slices are respectively measured at the same location within the MR system. All slices are therefore measured similarly again.

Among other things, a high homogeneity of the $B_0$ field is necessary for a uniform fat suppression in the acquired MR images.

With an appropriate design of the magnet of the MR system and stationary shim measures (for example ferromagnetic materials mounted at a suitable location at the MR system), a specified homogeneity of the magnetic field is achieved in the defined spherical or cylindrical measurement volume of the MR system. The homogeneity of the magnetic field in the measurement volume that is achieved in such a manner is, however, disrupted by the introduction of a patient or other examination subject into that volume.

In a shim adjustment, the actual field curve of the magnetic field can be measured and linear gradient fields can be determined that are superimposed on the basic magnetic field in order to at least approximately reestablish the homogeneity of the magnetic field in a target volume (for example the measurement volume or a portion of the measurement volume from which diagnostic measurement data will be acquired during a subsequent MR examination). The linear gradient fields are normally generated with the use of the three gradient coils that are also used for the spatial coding. For this purpose, for each gradient coil a current, known as the offset current, is superimposed on the gradient current (for example for the spatial coding) that is predetermined by the pulse sequence. The linear field contributions that are realized with such a gradient offset current are also called shim channels of a first order.

The homogeneity in the target volume can normally be increased by additional special shim coils having a suitable power supply and amplifiers. Five such shim coils typically exist in MR systems, which shim coils produce a field contribution with a spatial dependency described in Cartesian coordinates by xy, xz, yz, $x^2$-$y^2$, $z^2$. This field contribution increases linearly with the current through the respective coil. In the literature, such a contribution is also referred to as being produced by a shim channel, and such additional shim coils are thus also called shim channels of a second order.

However, both the examination subject in the measurement volume and the shim currents in the shim channels influence the effective field strength, and therefore the resonance frequency of the MR system. Therefore, after the examination subject has been moved into the measurement volume and after the shim currents have been defined and set, the RF center frequency is re-determined in a procedure known as a frequency adjustment. This is particularly necessary when spectral saturation or excitation methods are used during the data acquisition (for example for fat suppression).

If data from different target volumes in the patient are acquired during the MR examination, the shim adjustment and the subsequent frequency adjustment that are described above must be repeated for each target volume. This is the case if the examination subject is moved between individual measurements in the examination.

MR examination techniques are already available in which the patient or an examination subject on an examination bed is driven continuously through the MR system together with the examination bed during the acquisition of the measurement data (referred to herein the measurement). For example, such MR examination techniques are distributed by Siemens AG under the product name "syngo TimCT Oncology".

In these particular situations when the measurement itself takes place given a continuously moved patient bed (also known as "move during scan" (MDS), "continuously moving table MRI" (CMT) or "syngo TimCT"), the target volume constantly changes.

In numerous publications about such MR measurements that are implemented during continuous movement of the examination subject (the patient, for example), patient-specific adjustment measurements (for example to determine the necessary shim currents and the RF center frequencies) are completely omitted, and instead patient-independent system values or empirically determined experimental values for the load-dependent adjustment values are used, even though limitations in the image quality must be accepted as a consequence.

One exception is the work by A. Shankaranarayanan and J. Brittain: "Continuous Adjustment of Calibration Values for Improved Image Quality in Continuously Moving Table Imaging", Proc. Intl. Soc. Mag. Reson. Med. 11 (2004), #103. There it is proposed to determine adjustment values at 16 stations distributed over the entire body of a patient before the actual MR measurement in a "prescan". During the continuous travel of the examination bed in the actual radial MR measurement, the determined adjustment values (shim currents of 1st order, RF center frequency and reference transmitter voltage) are respectively adapted after the acquisition of $N_r$ spokes. Since the actual bed position normally does not coincide with one of the 16 node points, the current adjustment values are determined with linear interpolation.

From U.S. Pat. No. 7,145,338, a method is known in which adjustment values are determined during continuous travel of the bed. In a subsequent high-resolution diagnostic examination, these adjustment values are then applied depending on the position of the patient bed.

A shim adjustment in which the gradient offset currents are determined depending on the position of the examination bed can also be implemented given continuous travel. The gradient offset currents determined during the shim adjustment are then applied both in subsequent further adjustment measurements (in particular RF center frequency adjustment) and in subsequent (for example high-resolution) diagnostic MR examinations, depending on the current bed position and therefore on the current position of the examination subject in the measurement volume.

The current through the shim channels of the second order is normally not varied given MR measurements with continuous travel of the examination subject. The reason is that these channels, at least in current MR systems, are not similarly equipped with powerful amplifiers like the shim channels of the first order (gradient coils), and therefore too long of a time duration would have to pass before the desired $B_0$ field contribution were set. Rapid switching during such continuous travel therefore is not possible.

Such an MR examination technique with continuous travel of the examination subject is used in a procedure known as "tumor staging", among other things. In oncology, what is designated as tumor staging is the portion of the diagnosis that serves to establish the degree of propagation and the metastisizing of a malignant tumor. The MR examination normally uses a spoiled gradient echo sequence (also known as a FLASH sequence, "Fast Low Angle SHot") with spectral fat suppression.

In spectral fat suppression, use is made of the fact that the resonance frequency of protons that are bound in fat molecules differs from the resonance frequency of those that are bound in water molecules by 3.3 to 3.5 parts per million (ppm), thus by approximately 217 Hz at 1.5 T. Therefore, in spectral fat suppression a spectrally selective excitation pulse that flips the protons that are bound in fat molecules in the transverse plane, and that does not affect protons that are bound in water molecules, is switched (activated) before each acquisition module, or for a series of acquisition modules. The magnetic resonance signals emitted by the fat-bound protons in such a manner is known as the fat signal, and subsequently dephased with a spoiler gradient. In signals acquired immediately following this spoiler gradient by means of the following acquisition modules in the sequence, the fat signal then no longer produces a contribution, or at the least has at most a strongly suppressed signal contribution. An "acquisition module" is a portion of the overall sequence that is executed for selective excitation of a slice, the coding of the signal emitted that results from this excitation, and the readout of this signal. Multiple acquisition modules of each slice are normally necessary for complete data acquisition of the respective slice. In spectral fat suppression, a constant $B_0$ field (and therefore a respective constant resonance frequency for each of water and fat) within the slice is a requirement for a uniform fat suppression in the images that are calculated (reconstructed) from the data acquired in such a manner. Due to the aforementioned individual disruption of the $B_0$ field by the patient, this is achieved only when a shim and frequency adjustment is implemented as described above.

However, in practice massive ghost and smearing artifacts are often observed (primarily in the throat region of an examined patient) with the setting of the adjustment values as described above depending on the current bed position in examinations with continuously moving examination subject, which artifacts hinder a diagnosis on the basis of the MR images acquired during continuous travel, or make it entirely impossible. These artifacts are not observed, or at least not to this degree, given a corresponding conventional Flash measurement (given a stationary patient bed) and in other body regions, even given a traveling bed. The throat region is particularly important for tumor staging since cancer can propagate (metastasize) from its origin to lymph nodes of the neck or the cervical spinal region.

SUMMARY OF THE INVENTION

An object of the present invention is to provide a method to adjust at least one shim current in a gradient coil of a magnetic resonance apparatus and an associated RF center frequency for a radio-frequency antenna of the magnetic resonance apparatus for an interleaved, multislice MR examination that is implemented given a continuously moved examination subject, as well as a corresponding magnetic resonance apparatus and a corresponding electronically readable data storage medium, that increase the image quality of the interleaved multislice MR measurement so the artifact described above can no longer occur, or occurs only to a significantly reduced extent.

The invention is based on the following considerations. The resonance condition of an MR system can be written as follows:

$$\omega_{RF}(\vec{x},t)=\gamma(\vec{x}\cdot\vec{G}(t)+B_0^{loc}(\vec{x})+\Delta B_0^{shim}(\vec{x})) \quad (3).$$

$\gamma$ is the gyromagnetic ratio, $\vec{G}(t)$ is the switched gradient fields, $\vec{x}$ is the interval vector from the isocenter of the gradient coils, $B_0^{loc}(\vec{x})$ is the $B_0$ field generated by the basic magnet and spatially dependent as a result of the interference by the examination subject, and $\Delta B_0^{shim}(\vec{x},t)$ is the field contributions generated with the aid of the shim channels of order higher than one. The vector $\vec{G}(t)$ here includes both the gradient fields $\vec{G}^{Sequence}(t)$ provided by the sequence and the fields $\vec{G}^{Shim}(n)$ of the shim channels of the first order that are generated by the offset currents:

$$\vec{G}(t)=\vec{G}^{Sequence}(t)+\vec{G}^{Shim}(n) \quad (4)$$

The parameter n is introduced in order to differentiate between different shim current settings (for example as a function of a current bed position). In the field $\Delta B_0^{shim}(\vec{x})$ linked with the shim channels of higher order, this differentiation is omitted since, for the aforementioned reasons, the associated currents are not changed during the travel of the examination subject.

Furthermore, $\omega_0(n)$ is the center system frequency belonging to the n-th shim current setting.

The signal $S(t)$ of an excited slice can be written as follows if the T2 decay is ignored:

$$S(t) = \int_{Slice} \rho(\vec{x}) e^{-i\int \Delta\omega(\vec{x},\tau,n)d\tau} d\vec{x}, \quad (5)$$

wherein $\rho(\vec{x})$ is the spin density at location $\vec{x}$ in the examined slice, and $$\Delta\omega(\vec{x},t,n)=\gamma(\vec{x}\cdot(\vec{G}^{Sequence}(t)+\vec{G}^{Shim}(n))+\Delta B_0^{loc}(\vec{x},n)+\Delta B_0^{Shim}(\vec{x})) \quad (6)$$

is the off-resonance term, with $$\Delta B_0^{loc}(\vec{x}, n) = B_0^{loc}(\vec{x}) - \frac{1}{\gamma}\omega_0(n). \quad (7)$$

In a gradient echo sequence, between the excitation point in time t=0 and the readout time t=TE a spin at location $\vec{x}$ thus acquires the phase:

$$\Delta\phi(\vec{x}, n) = \quad (8)$$
$$\gamma\int_0^{TE}\left(\vec{x}\left(\vec{G}^{Sequence}(t) + \vec{G}^{Shim}(n)\right) + \Delta B_0^{loc}(\vec{x}, n) + \Delta B_0^{Shim}(\vec{x})\right)dt$$

The goal of the adaptation of the shim setting and the subsequent RF center frequency adjustment is that the terms $\vec{G}^{Shim}(n)$, $\Delta B_0^{loc}(\vec{x},n)$ and $\Delta B_0^{Shim}(\vec{x})$ add up to exactly zero at each location in the target volume, and thus each spin acquires only phase as a result of the gradient fields $\vec{G}^{Sequence}(t)$ switched by the sequence. However, this is never completely achieved in a real shim current and RF center frequency adjustment method.

If the shim current and/or RF center frequency settings are now changed during the acquisition of a single slice, the terms $\gamma TE(\vec{x}\vec{G}^{Shim}(n)+\Delta B_0^{loc}(\vec{x}, n))$ that are thereby modified can lead to phase discontinuities (for example phase jumps) between adjacent hybrid space lines that were acquired with different settings. In Cartesian MR imaging, what is to be understood by hybrid space (and accordingly the hybrid space lines) is the data matrix (or, respectively, its lines) that is obtained after an inverse Fourier transformation along the readout direction.

These phase discontinuities could explain the aforementioned observed ghost and smearing artifacts. That these artifacts particularly occur in the throat region can be explained in that, experimentally, the resonance frequency in this region of the body changes particularly strongly with the bed position.

Given a sequential acquisition of slices (as described above for sequences with short TR), such phase discontinuities can be prevented, for example in that the shim current and/or RF center frequency settings are varied as a function of a current table position only between the acquisition of complete slices.

Further below, it is shown in connection with FIG. 1 that the switching of the adjustment values as a function of the current bed position in an interleaved multislice measurement with moving examination subject and more than one excitation per slice leads unavoidably to the situation that a defined slice different shim and RF center frequency settings is measured, and it can thus lead to phase discontinuities for the reasons cited above.

A method according to the invention to adjust at least one shim current in a shim channel of a magnetic resonance apparatus and an associated RF center frequency for the radio-frequency system of the magnetic resonance apparatus during an interleaved multislice MR measurement of a moving examination subject, in which MR measurement at least two excitations are implemented to completely acquire the desired data of a slice of the examination subject to be measured, implements the multislice MR measurement such that phase discontinuities are avoided between measurement data acquired after individual excitations.

In an exemplary embodiment, the method includes the computer-implemented steps of providing a respective adjustment value for a shim current for at least one shim channel and a respective adjustment value for an associated RF center frequency for at least two different positions of the examination subject in the measurement volume, starting an interleaved multislice MR measurement of a moving examination subject, and selecting and adjusting the shim current of the at least one shim channel and an associated RF center frequency during the interleaved multislice MR measurement on the basis of the provided adjustment values, such that a defined slice is always measured with the same shim current and RF center frequency setting during the multislice MR measurement.

Because the same adjustment values are active (effective) between each excitation in each readout of measurement data of a defined slice, phase discontinuities in the acquired data can be avoided, with which a significantly improved image quality is achieved in the MR images reconstructed from the measurement data in which the interfering artifacts cited above are largely suppressed.

In one embodiment, settings for shim currents and RF center frequency are selected for a respective slice so as to be optimal for the position at which measurement data that include the k-space center are acquired in the multislice MR measurement are respectively selected for a slice. Which values are optimal is defined in the conventional manner such as on the basis of the (for example predetermined) adjustment values, either by selection of an adjustment value determined at a corresponding position or by interpolation between two adjustment values which were determined [sic] positions adjacent to the desired position. Such a selection of the settings for the shim currents and the RF center frequency is advantageous since the k-space center has significant influence on the MR image reconstructed later from the measurement data, in particular its contrast, and thus the shim current and RF center frequency settings are selected to be optimized according to the position of the most important data acquisition.

In one embodiment, the pulse sequence used for the multislice MR measurement to suppress an unwanted signal component has at least one spectrally selective RF pulse, and for the duration of radiation of the spectrally selective RF pulse or pulses the shim current of the at least one shim channel and the associated RF center frequency are adjusted such that their values are optimal, based on the presently provided adjustment values for the current position of the examination subject at the respective radiation time of the respective spectrally selective RF pulse. A suppression of unwanted signal components (of fat, for example) is desired in many examinations. A particularly homogeneous measurement field in the measurement volume at the radiation time of the spectrally selective pulses can be achieved via the described adjustment of the shim currents and RF center frequencies, which enables a uniform spectral suppression of unwanted signals (for example a uniform spectral fat suppression), wherein at the same time the advantages described above are preserved for the imaging.

In another exemplary embodiment, the multislice MR measurement takes place by means of a sliding multislice (SMS) technique. The SMS technique is a special interleaved multislice MR measurement given a moving examination subject that acquires corresponding k-space lines of different slices at the same positions within the MR system, and therefore avoids acquisition-dependent differences between the slices as they occur in other measurement methods.

In an alternative exemplary embodiment, phase discontinuities are avoided by, between an excitation and an associated readout, using a pulse sequence for the multislice MR measurement that has a gradient scheme that compensates for discontinuities that arise due to switching of the shim currents.

In this exemplary embodiment, the optimal shim current and RF center frequency setting for the current position of the examination subject each can be selected without the disadvantages described above.

A magnetic resonance apparatus according to the invention has a patient bed that can be moved continuously through the measurement volume of the magnetic resonance apparatus, a basic field magnet, a radio-frequency system having at least one radio-frequency antenna to radiate RF pulses and receive echo signals, a gradient system having gradient coils to switch gradient fields, and a computer that controls the individual system components of the magnetic resonance apparatus corresponding to a method described above.

The above object also is achieved in accordance with the present invention by a non-transitory, computer-readable data storage medium encoded with programming instructions (code, software) that, when the storage medium is loaded into a computerized control system of a magnetic resonance apparatus, cause the control system to operate the magnetic resonance apparatus to implement any or all embodiments of the method according to the invention described above.

The advantages described with regard to the method analogously apply to the magnetic resonance apparatus, and the electronically readable data storage medium.

BRIEF DESCRIPTION OF THE DRAWINGS

FIG. 4 is an example of a pulse sequence scheme with suppression of an unwanted signal component.

FIG. 5 schematically illustrates design of a magnetic resonance apparatus with which the method according to the invention can be implemented.

DESCRIPTION OF THE PREFERRED EMBODIMENTS

Figure 1:
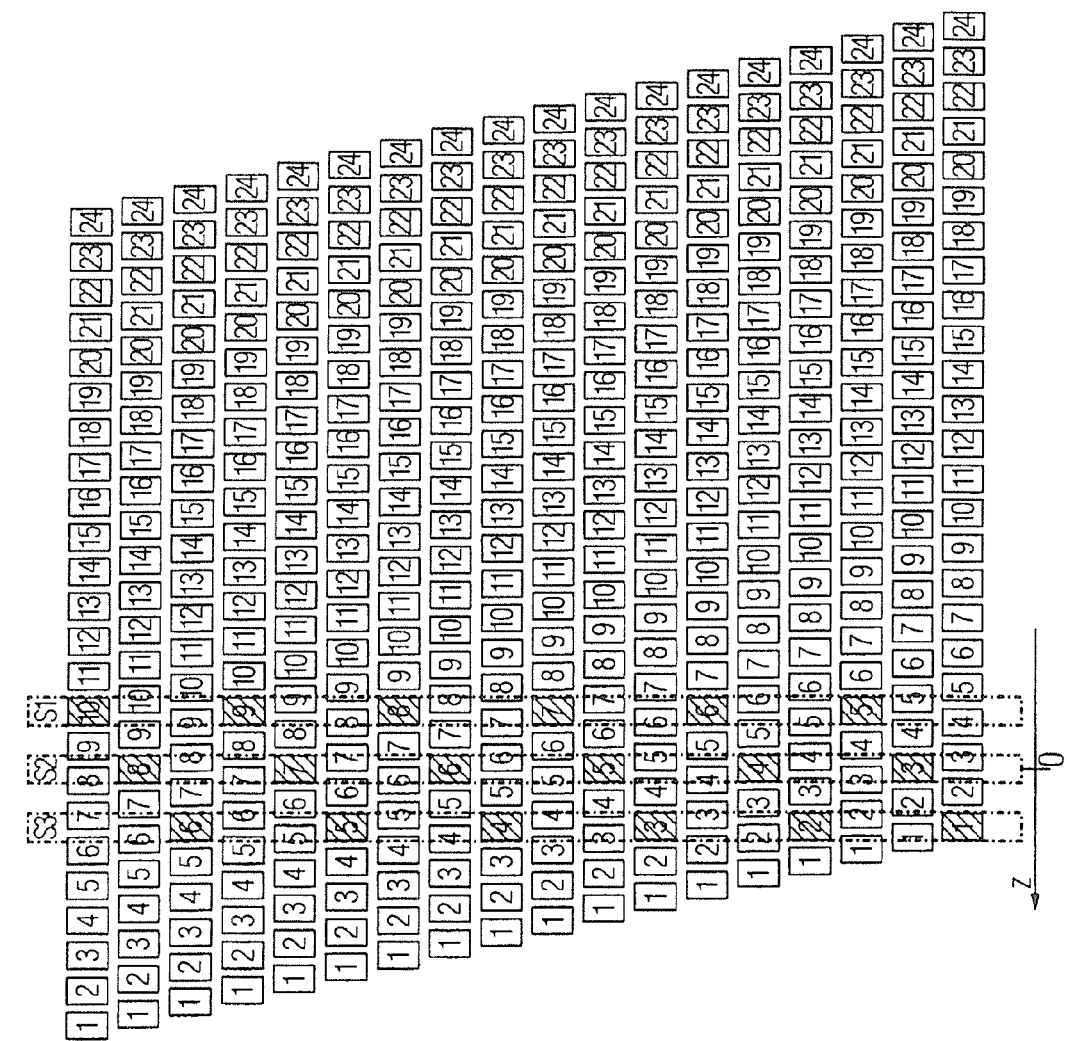
FIG. 1 is a schematic representation of an interleaved acquisition of slices of an examination subject with associated shim current and RF center frequency settings according to the prior art.

In the following, with the use of FIG. 1 it is shown how, given an interleaved acquisition of the slices, an adjustment of the shim current values and/or RF center frequency values as a function of the current table position according to the prior art inevitably leads to variations of the settings during the acquisition of a slice:

FIG. 1 shows the acquisition of a total of 24 slices to be examined (designated with the respective slice index 1 . . . 24) using the SMS technique as an interleaved acquisition technique. The shown slices 1 . . . 24 can correspond to anatomical slices of a patient, for example.

The horizontal z-axis points in the direction of the bed feed. The respective position of the slice stack as a function of time is plotted in the vertical direction. Significantly simplified, it is thereby assumed that three excitations are necessary for complete acquisition, for which the slices are accordingly subdivided into three segments. According to the SMS scheme, corresponding k-space segments of different slices are acquired at the same position within the MR system. A first segment after a first excitation at location S1, a second segment (after a second excitation) at location S2, and a third segment (after a third excitation) at location S3 [sic]. In total, data of 6 slices are respectively acquired per TR interval in the shown example. The time resolution of the imaging is thus ⅙ of a TR interval (see time scale to the right, "t[TR]").

Data of a segment of precisely one slice are thus acquired during a shown time interval (⅙ TR). This slice respectively has a grey background. To the right of the table, the respective time t (in units of TR) is in the first column, the current bed position z (in units of slice intervals d) is in the second column and the index n of the respective corresponding shim current and RF center frequency setting is in the third column. It is thereby assumed that the shim and RF center frequency adjustment is respectively adapted as a function of the current bed position before the excitation of a slice.

The shim and RF center frequency setting with the index n=1 is thus ascribed to values that were determined in a (preceding) adjustment measurement with the bed position z=0; the shim and RF center frequency setting with the index n=2 is ascribed to values that were determined in an adjustment measurement with bed position z=⅓×d, etc. If, for a required current bed position, no adjustment results exist for exactly this bed position, the shim current setting and RF center frequency setting for the current bed position are interpolated from the results of the adjustment measurement for adjacent bed positions.

For example, the slice with index 5 is now considered. This is the first slice that is measured completely (all three segments) in the drawn time interval. Its first segment is measured at the time t=⅓×TR with the shim current and RF center frequency setting n=3, associated with the current table position z=⅔×d; its second segment is measured at the time t=7/6×TR with the shim current and RF frequency setting n=8, associated with the current table position z=7/3×d; and its third segment is measured at the time t=2×TR with the shim current and RF frequency setting n=13, associated with the current table position z=4×d. This means that the slice 5 is measured with three different shim current and RF center frequency settings. As presented above, this can lead to two (or more—depending on the segmentation of k-space) phase discontinuities. This problem analogously applies to other slices.

It should be noted that, within the scope of the updating as a function of a current table position, the problem cannot be solved by a delayed updating of the shim and RF center frequency setting. Even if the settings are modified at the time t=⅓×TR, for example, and these settings are maintained until and through t=2×TR in order to measure the slice with index 5 with unmodified shim and RF center frequency setting, and the shim and RF center frequency setting is thus only updated again at time t=13/6×TR, the problem is in fact solved for the slice 5. However, the slices 6 and 7 at the point in time t=13/6×TR have already been partially measured, and after the updating of the shim and RF center frequency setting at the time t=13/6×TR measurement takes place again with another (and therefore as a whole with different) shim and RF center frequency settings. An additional delay of the updating shifts the problem correspondingly to other slices and furthermore leads to the situation that measurement is off-resonance in an inhomogeneous field.

Figure 2:
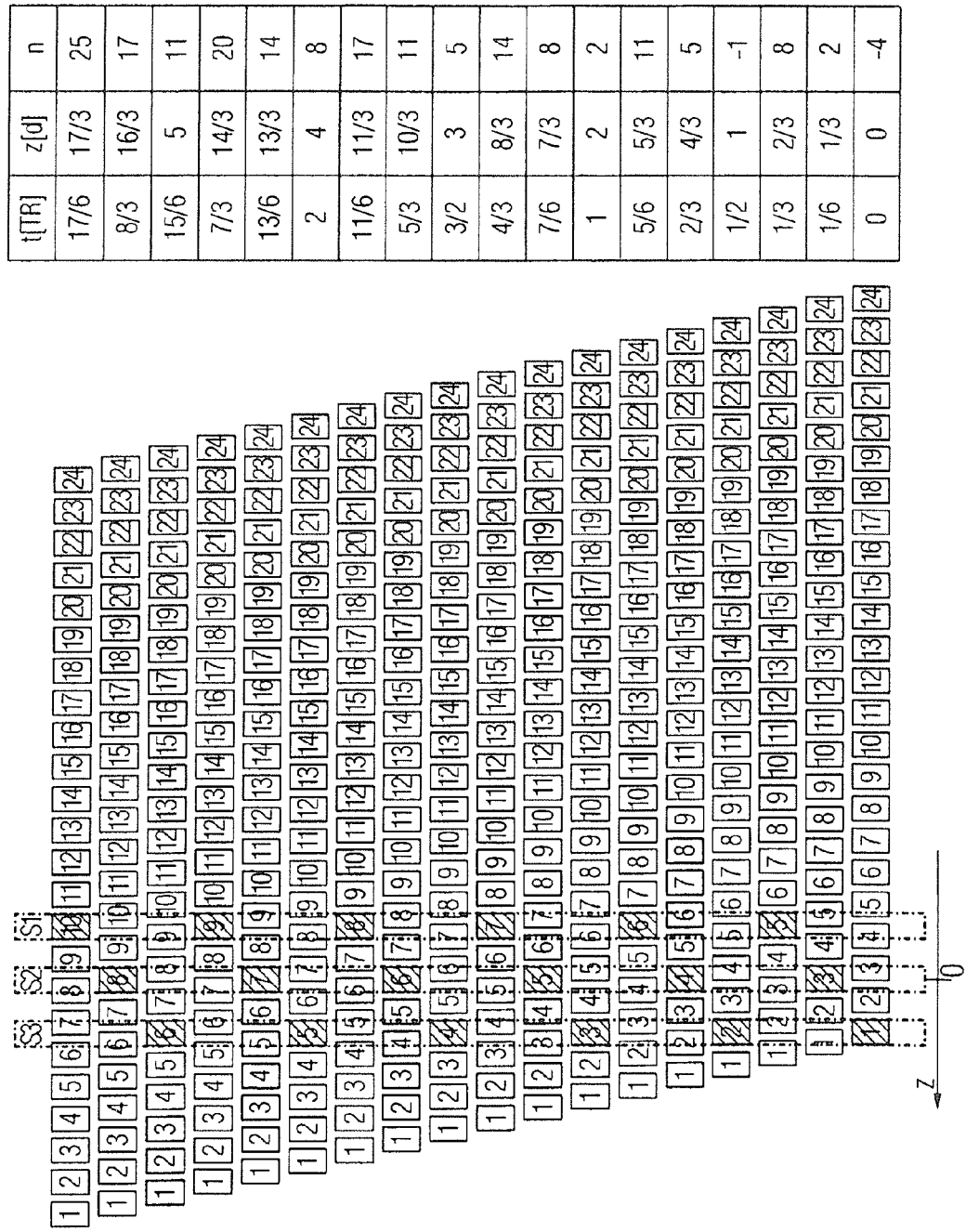
FIG. 2 is a schematic representation of an interleaved acquisition of slices of an examination subject with associated shim current and RF center frequency settings according to a method according to the invention.

An interleaved acquisition of 24 slices in total using the SMS technique for better comparability corresponding to FIG. 1, but with a selection of the shim and RF center frequency settings (third column to the right) according to the invention, is shown in FIG. 2.

The updating of the shim and frequency setting respectively takes place in turn before the excitation of a slice. However, the selection of the shim current and RF center frequency for each acquisition does not take place as in FIG. 1 as a function of the current bed position; rather, this selection takes place such that a defined slice is always measured with the same shim current and RF center frequency setting.

For a defined slice, the set of shim current and RF center frequency settings is therefore preferably selected that belongs to the bed position at which that segment of the slice is measured that contains the k-space center line or, respectively, the k-space center in general. In FIG. 2 it is assumed that the k-space center line is respectively acquired at the measurement position S2.

The indexing of the shim current and RF center frequency setting n in FIG. 2 is analogous to as in FIG. 1, with n as a function of the progressing bed position. In other words: the values of the shim current and RF center frequency setting with index n=1 were determined for a bed position z=0, the set of shim current and RF center frequency setting was determined with index n=2 for the bed position z=⅓×d, etc.

For the time intervals during which data are acquired at location S2 within the system, the respective shim current and RF center frequency setting is thus unchanged relative to the prior art. However, in the remaining time intervals it is varied, and in fact such that the set of shim current and RF center frequency settings is selected that is associated with the measured slice during the respective time interval. The selection of the shim current and RF center frequency setting thus does not take place depending on the bed position but rather depending on the currently measured slice.

If slice 5 is again considered as an example, all segments of this slice 5 are respectively measured under the shim current and RF center frequency setting with index n=8 (which corresponds to the bed position z=7/3d at which the k-space center of slice 5 is measured) with the method according to the invention. This analogously also applies to all additional slices. Shim current and RF center frequency settings with negative index n=−4 or, respectively, n=−1 that respectively correspond to the bed position at which the k-space center of slice 1 or, respectively, 2 was previously measured (not shown in the selected section of FIGS. 1 and 2) occur for slices 1 and 2.

Discontinuities of the phase are prevented in hybrid space via the selection of the shim current and RF center frequency values according to FIG. 2 since it can be assumed both that $B_0^{loc}(\vec{x})$ (and therefore $\Delta B_0^{loc}(\vec{x},n)$ for fixed n) changes continuously with the bed position, and that a linear organization scheme of the k-space lines is used in the acquisition (i.e. adjacent lines in k-space/hybrid space are acquired in chronological succession).

It is noted that the absolute "phase error":

$$\Delta\phi^{unwanted}(\vec{x}, n) = \gamma \int_0^{TE} \left( \vec{x} \vec{G}^{Shim}(n) + \Delta B_0^{loc}(\vec{x}, n) + \Delta B_0^{Shim}(\vec{x}) \right) dt \quad (9)$$

of a peripheral line that is acquired at location S1 or S3 can by all means be greater than in the prior art since, in the method according to the invention, this was measured with a shim current and RF center frequency setting that was determined for a different bed position (and is suboptimal for the current bed position). However, it has been shown that this has less of a negative effect on the image quality of the MR images reconstructed from the data so acquired than the discontinuous phase errors as a result of the updating of the shim current and RF center frequency setting as a function of the current bed position. In contrast, in this way a significantly improved image quality can be achieved, and the interfering artifacts cited above can be largely suppressed.

Figure 3:
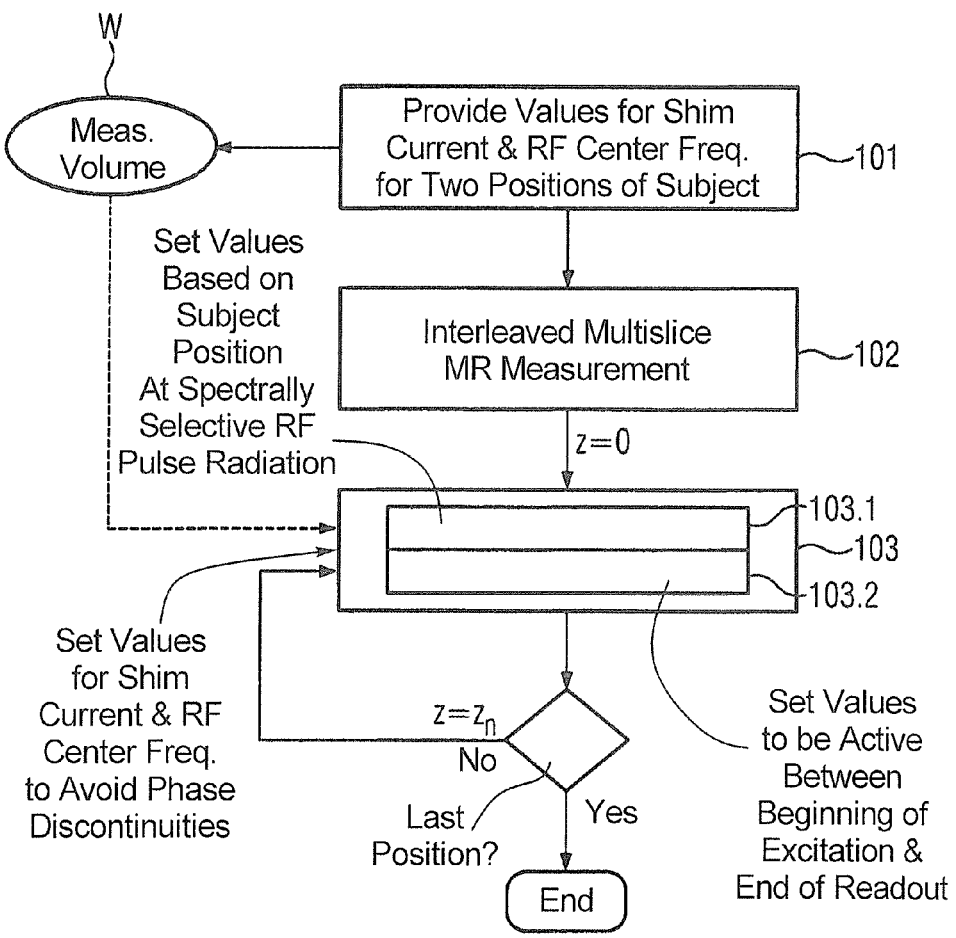
FIG. 3 is a flow chart of an embodiment of the method according to the invention.

FIG. 3 schematically shows a flowchart of an embodiment of the method according to the invention for the adjustment of at least one shim current in a shim channel of a magnetic resonance apparatus and an associated RF center frequency for the radio-frequency system of the magnetic resonance apparatus during an interleaved multislice MR measurement of a moving examination subject, in which MR measurement at least two excitations are implemented for complete acquisition of the desired data of a slice of the examination subject that is to be measured.

An adjustment value for a shim current for at least one shim channel and an adjustment value for an associated RF center frequency for at least two different positions of the examination subject are thereby initially provided in the measurement volume W (Block 101). For example, the adjustment values for the shim current and the RF center frequency W can have been determined in advance for what is known as a prescan for at least the two cited positions, or similarly in a separate travel of the examination subject through the magnetic resonance apparatus given a moving examination subject, for example.

If an interleaved multislice MR measurement of a moving examination subject is now started (Block 102), the examination subject is initially located at a first position z=0 when the first excitation is radiated to acquire measurement data of a first slice in the examination subject. Given additional excitations, the examination subject is respectively located at a different new position $z_n$. During the interleaved multislice MR measurement, for each excitation and the associated acquisition of measurement data (readout) on the basis of the provided adjustment values, values for the shim current of the at least one shim channel and the associated RF center frequency are selected and set such that phase discontinuities between measurement data acquired after individual excitations are avoided (Block 103).

For this purpose, the values for the shim current of the at least one shim channel and the associated RF center frequency are, for example, selected and set such that a slice of the examination subject is always measured with the same shim current and RF center frequency setting during the entire multislice MR measurement.

Alternatively, given use of a pulse sequence with a gradient scheme which already compensates for phase discontinuities that arise due to a switching of the shim currents (as is described in detail with reference to FIG. 4), the values for the shim current of the at least one shim channel and the associated RF center frequency are selected and set such that the highest (on the basis of the present information) B0 field homogeneity could always be established in that the respective optimal setting for the current position is selected on the basis of the provided adjustment values.

The values for shim current and RF center frequency with regard to the data acquisition of a slice are thereby set such that these are effective at the latest beginning with an excitation of a respective slice and at least until the end of a readout of this slice that belongs to the excitation (Block 103.2).

In addition to the imaging sequence (excitation and readout), the pulse sequence used for the multislice MR measurement can comprise at least one spectrally selective RF pulse and possibly associated spoiler gradients to suppress an unwanted signal component. For the duration of radiation of these spectrally selective RF pulses, the shim current of the at least one shim channel and the associated RF center frequency can be adjusted such that their values are optimal based on the provided adjustment values for the position of the examination subject that is current at the respective radiation time of the respective spectrally selective RF pulse (Block 103.1). During the duration of radiation of the spectrally selective pulse, an optimal saturation of unwanted signal components is thus ensured via the selection of the optimal shim current and RF center frequency setting for the current bed position, and an improved image quality is subsequently achieved during the excitation and the readout of the desired signals via selection of a shim current and RF center frequency setting defined for the respective read-out slice. It is noted that, in general, a spectrally selective pulse is also not switched before each excitation and each readout of a slice (Block 103.2).

If the examination subject arrives at the last desired position, and if the last desired measurement data are acquired under the respective optimal shim current and RF center frequency settings according to the invention, the methods ends ("end").

FIG. 4 schematically shows an example of a pulse sequence scheme with which a segment of a slice can be excited and corresponding data of the segment can be acquired.

For this purpose, spins in a slice of the examination subject that is to be examined are excited with an excitation pulse RFa (Region B), wherein an echo ES is generated which is read out by means of a readout gradient (Region D). To suppress an unwanted signal component before the excitation, a spectrally selective RF pulse RFs that excites the spins of a substance in the examination subject (for example a specific tissue in an examined person) that should provide no contribution in the later acquisition (for example fat for what is known as a fat saturation) can possibly be switched before the excitation.

To achieve this, the signals excited with the spectrally selective RF pulse RFs are, for example, dephased (Region A) by means of one or more of what are known as spoiler gradients (in the Gx-, Gy- and Gz-direction) before the imaging sequence is started for the desired data acquisition (Regions B through E). For example, a slice selection gradient in the Gz-direction is switched during the excitation by the excitation pulse RFa (Region B). For the spatial coding, a respective different phase coding gradient (shown here as a dotted gradient in the Gy-direction) can be switched before each readout (of a k-space line) (Region C). To read out the echo ES, a readout gradient (here in the Gx-direction) can be switched for frequency coding during the echo (Region D). Furthermore, as depicted, gradients can be [sic] in the z-direction for slice refocusing in the x-direction for readout pre-phasing (in Region C), and gradients can be [sic] in the y-direction for refocusing of the phase coding gradients and in the x- and z-direction for dephasing of the remaining transversal magnetization (Region E).

In an alternative embodiment of the invention, phase discontinuities that arise as a result of the switching of the shim channels of the 1st order are compensated via the switching of additional gradients in the pulse sequence that is used, between excitation of the slice and readout of the data.

For example, for this one or more additional gradient pulses can be switched in the time interval between the radiation of the excitation pulse and the readout of the echo signal (Region C in FIG. 3), the accumulated 0th moment of which gradient pulses is provided by $$TE(\vec{G}^{Shim}(n_0) - \vec{G}^{Shim}(n)) \quad (10),$$

wherein $\vec{G}^{Shim}(n)$ is the gradient field that is caused by the shim currents of the 1st order that are active during the acquisition of this k-space line, and $\vec{G}^{Shim}(n_0)$ is the gradient field that is produced by shim currents of the 1st order that are active during the acquisition of an arbitrary k-space reference line of this slice (for example the k-space center line).

In practice the gradient moment will be combined with the gradients that are switched (anyway) for reasons of the sequence technique (for example, in the example of FIG. 4 with the slice refocusing gradient (z-direction), the phase coding gradient (y-direction) and/or the readout pre-phasing gradient (x-direction) in Region C). However, the limits of the gradient system (for example maximum possible amplitudes and maximum possible slew rate) and stimulation limits are thereby respectively to be taken into account.

For example, the z-component of Equation 10 could be taken into account in that the amplitude of a symmetrical trapezoidal slice refocusing pulse is changed by the following value:

$$\Delta G = (G_z^{Shim}(n_0) - G_z^{Shim}(n)) \frac{TE}{\Delta T_{GSR}} \quad (11)$$

wherein $\Delta T_{GSR}$ is the duration of the slice refocusing gradient (defined as a plate duration plus a ramp duration).

The same correspondingly applies for the x-component of Equation 10 and the readout pre-phasing gradient and the y-component of Equation 10 and the phase coding gradient.

Such an adaptation of the gradient to avoid phase discontinuities would have the advantage that the greatest (based on the present information) B0 field homogeneity could always be produced during the duration of radiation of the excitation pulse RFa and during the readout time (readout gradient during the echo signal). For example, a displacement of the actual excited slice relative to the desired position of the slice is thereby minimized. However, such an implementation is particularly advantageously complicated (in particular due to the necessary consideration of the limits of the gradient system and the stimulation limits) and could also result in a TE extension (TE: echo time, time between excitation pulse and echo signal).

FIG. 5 schematically shows the basic design of a magnetic resonance apparatus 1 that is designated to implement the above-described method. In order to examine a body by means of magnetic resonance imaging, various magnetic fields, that are matched to one another as precisely as possible in terms of their temporal and spatial characteristics, are radiated into the body of an examination subject.

A strong basic field magnet (typically a cryomagnet) 5 arranged in a measurement chamber 3 that is radio-frequency-shielded, which magnet 5 has a tunnel-shaped opening, generates a static, strong basic magnetic field 7 that is typically 0.2 to 7 tesla or more. An examination subject, a body or a body part that is to be examined (represented here as a patient P) is borne on a patient bed 9 that can be moved continuously through the measurement volume, which patient bed is controlled by the bed control unit 40.

The excitation of the nuclear spins of the body takes place by magnetic radio-frequency pulses (RF pulses) of defined RF frequencies that are radiated via a radio-frequency antenna (shown here as a body coil 13). The radio-frequency excitation pulses are generated by a pulse generation unit 15 that is controlled by a pulse sequence control unit 17. After an amplification by a radio-frequency amplifier 19, they are relayed to the radio-frequency antenna. The radio-frequency system shown here is only schematically indicated. Typically, more than one pulse generation unit 15, more than one radio-frequency amplifier 19 and multiple radio-frequency antennas are used in a magnetic resonance apparatus 1.

Furthermore, the magnetic resonance apparatus 1 has gradient coils 21 with which magnetic gradient fields are switched in a measurement, for example for selective slice excitation and for spatial coding of the measurement signal. The gradient coils 21 are controlled by a gradient coil control unit 23 that, like the pulse generation unit 15, is connected with the pulse sequence control unit 17. The pulse sequence control unit 17 is designed such that a pulse sequence according to the invention can be generated.

The signals emitted by the excited nuclear spins are received by the body coil 13 and/or local coils 25, amplified by associated radio-frequency preamplifier 27 and additionally processed and digitized by a receiver 29.

In the case of a coil that can be operated both in transmission mode and reception mode—for example the body coil 13—the correct signal relaying is regulated by an upstream transmission/reception diplexer 39.

An image processing unit 31 generates from the measurement data an image that is presented to a user via an operating console 33 or be stored in a memory unit 35. A central computer 37 controls the individual system components, in particular during the acquisition of the measurement data. The central computer 37 is designed such that a movement of the patient bed 9 and pulse sequences according to the present invention and a method according to the invention can be implemented. For example, for this purpose a computer programming instructions (code) according to the invention are loaded into or embodied in the computer 37 such that the above-described can be executed. The programming instructions can be stored on an electronically readable data storage medium (a DVD 39, for example) such that instructions/code can be read from the DVD 39 and executed by the central computer 37.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for implementing an interleaved multislice magnetic resonance (MR) measurement of a moving examination subject, comprising:
   providing a computerized control unit of an MR data acquisition unit with an adjustment value for a shim current in a shim channel of the MR data acquisition unit, and an adjustment value for a radio-frequency (RF) center frequency of an RF system of the MR data acquisition unit for at least two different positions of a moving examination subject in a measurement volume of the MR data acquisition unit;
   continuously moving an examination subject through said MR data acquisition unit;
   while continuously moving the examination subject through the MR data acquisition unit, acquiring MR data from the subject in an interleaved multislice MR data acquisition procedure in which a basic magnetic field is generated in a measurement volume of the MR data acquisition unit and in which at least two successive excitations of nuclear spins in a slice of the examination subject are produced by radiation of respective RF pulses by the RF system, and acquiring MR data from said slice after said at least two successive excitations of the nuclear spins in said slice; and
   from said computerized control unit, controlling shimming said basic magnetic field to achieve a desired homogeneity of said basic magnetic field at least in said measurement volume by selecting and adjusting the shim current in said shim channel and selecting and adjusting an associated RF center frequency during said interleaved multislice MR measurement dependent on the provided adjustment value for the shim current and the provided adjustment value for the associated RF center frequency for said at least two different positions, in order to cause a defined slice of the examination subject always to be measured with a same shim current and RF center frequency during said interleaved multislice MR measurement.

2. A method as claimed in claim 1 comprising setting said shim current in said shim channel and setting an associated RF center frequency to cause the set shim current and the set associated RF center frequency to be active no later than a beginning of a respective excitation of nuclear spins in said defined slice, among said at least two successive excitations, and at least until an end of readout of MR data from said defined slice resulting from said respective excitation.

3. A method as claimed in claim 1 comprising entering said MR data into an electronic memory in communication with said computerized control unit that represents k-space having a k-space center, and adjusting said shim current in said shim channel and an associated RF center frequency by selecting respective values for said shim current and said associated RF center frequency that are optimal for improving said homogeneity of said basic magnetic field at least in said measurement volume during acquisition of MR data from said defined slice in said interleaved multislice MR measurement that include said k-space center.

4. A method as claimed in claim 1 comprising operating said MR data acquisition unit with a pulse sequence in said multislice MR measurement that is configured to suppress an unwanted signal component and that comprises at least one spectrally selective RF pulse and comprising, for a duration of said at least one spectrally selective RF pulse, adjusting said shim current in said shim channel and the associated RF center frequency to respective values that are optimal for homogenizing said basic magnetic field at least in said measurement volume, for a current position of the continuously moving examination subject during the radiation of said at least one spectrally selective RF pulse.

5. A method as claimed in claim 1 comprising implementing said interleaved multislice MR measurement using a sliding multislice technique.

6. A method as claimed in claim 1 comprising implementing said interleaved multislice MR measurement with a pulse sequence that comprises at least one gradient pulse between each of said at least two successive excitations and readout of MR signals resulting from the respective excitation, configured to compensate for phase discontinuities in said MR data that occur due to switching of said shim current.

7. A magnetic resonance (MR) apparatus comprising:
   a magnetic resonance MR data acquisition unit;
   a patient bed operable to move an examination subject thereon continuously through a measurement volume of said MR data acquisition apparatus;
   said MR data acquisition apparatus comprising a radio frequency (RF) system having an RF center frequency, and a basic field magnet that generates a basic magnetic field in said measurement volume, and a shimming system comprising at least one shim channel;

a control unit provided with an adjustment value for a shim current in said shim channel and an adjustment value for an associated RF frequency for at least two different positions of the moving examination subject in the measurement volume;

said control unit being configured to operate said patient bed and said MR data acquisition unit to continuously move an examination subject through an MR data acquisition unit on the patient bed and, while continuously moving the examination subject through the MR data acquisition unit, acquire MR data from the subject in an interleaved multislice MR data acquisition procedure in which a basic magnetic field is generated by said basic field magnet in a measurement volume of the MR data acquisition unit and in which at least two successive excitations of nuclear spins in a slice of the examination subject are produced by radiation of respective RF pulses by said RF system, and acquire MR data from said slice after said at least two successive excitations of the nuclear spins in said slice; and said control unit being configured to operate said shimming system to shim said basic magnetic field to achieve a desired homogeneity of said basic magnetic field at least in said measurement volume by selecting and adjusting the shim current in said shim channel and selecting and adjusting an associated RF center frequency during said interleaved multislice MR measurement dependent on the provided adjustment value for the shim current and the provided adjustment value for the associated RF center frequency for said at least two different positions, in order to cause a defined slice of the examination subject always to be measured with a same shim current and RF center frequency during said interleaved multislice MR measurement.

8. A non-transitory, computer-readable data storage medium encoded with programming instructions that, when said data storage medium is loaded into a computerized control unit of a magnetic resonance (MR) apparatus, that comprises an MR data acquisition unit with a patient bed configured to continuously move an examination subject thereon through the MR data acquisition unit, a radio-frequency (RF) system having an RF center frequency, and a basic field magnet that generates a basic magnetic field in a measurement volume in said MR data acquisition unit, and a shimming system comprising at least one shim channel, and said programming instructions causing said computerized control system to:

receive, as an input, an adjustment value for a shim current in said shim channel and an adjustment value for an associated RF center frequency for at least two different positions of the moving examination subject in the measurement volume;

operate the patient bed to move the examination subject through the MR data acquisition unit on the patient bed;

while moving the examination subject through the MR data acquisition unit, operate the MR data acquisition unit to acquire MR data from the subject in an interleaved multislice MR data acquisition procedure in which the basic magnetic field is generated by said basic field magnet in the measurement volume of the MR data acquisition unit and in which at least two successive excitations of nuclear spins in a slice of the examination subject are produced by radiation of respective RF pulses by said RF system, and to acquire said MR data from said slice after said at least two successive excitations of the nuclear spins in said slice; and operate said shimming system shim said basic magnetic field to achieve a desired homogeneity of said basic magnetic field at least in said measurement volume by selecting and adjusting the shim current in said shim channel and selecting and adjusting an associated RF center frequency during said interleaved multislice MR measurement dependent on the provided adjustment value for the shim current and the provided adjustment value for the associated RF center frequency for said at least two different positions, in order to cause a defined slice of the examination subject always to be measured with a same shim current and RF center frequency during said interleaved multislice MR measurement.

* * * * *